United States Patent
Fang et al.

(10) Patent No.: US 11,196,013 B2
(45) Date of Patent: Dec. 7, 2021

(54) FLEXIBLE OLED DISPLAY PANEL AND DISPLAY MODULE

(71) Applicant: WUHAN CHINA STAR OPTOELECTRONICS SEMICONDUCTOR DISPLAY TECHNOLOGY CO., LTD., Hubei (CN)

(72) Inventors: Liang Fang, Hubei (CN); Ding Ding, Hubei (CN)

(73) Assignee: WUHAN CHINA STAR OPTOELECTRONICS SEMICONDUCTOR DISPLAY TECHNOLOGY CO., LTD., Hubei (CN)

(*) Notice: Subject to any disclaimer, the term of this patent is extended or adjusted under 35 U.S.C. 154(b) by 167 days.

(21) Appl. No.: 16/493,471

(22) PCT Filed: Apr. 12, 2019

(86) PCT No.: PCT/CN2019/082368
§ 371 (c)(1),
(2) Date: Sep. 12, 2019

(87) PCT Pub. No.: WO2020/155395
PCT Pub. Date: Aug. 6, 2020

(65) Prior Publication Data
US 2020/0280005 A1    Sep. 3, 2020

(30) Foreign Application Priority Data

Jan. 31, 2019 (CN) .......................... 201910099160.9

(51) Int. Cl.
   *H01L 51/00*     (2006.01)
   *H01L 27/32*     (2006.01)
   *H01L 51/52*     (2006.01)

(52) U.S. Cl.
   CPC ...... *H01L 51/0097* (2013.01); *H01L 27/3276* (2013.01); *H01L 27/3288* (2013.01);
(Continued)

(58) Field of Classification Search
   CPC ............. H01L 51/0097; H01L 27/3276; H01L 27/3288; H01L 51/5253; H01L 51/5281;
(Continued)

(56) References Cited

U.S. PATENT DOCUMENTS

2016/0014883 A1*   1/2016   Cho ..................... G06F 1/1652
                                                                                              361/749
2016/0351594 A1   12/2016   Shangguan et al.
(Continued)

FOREIGN PATENT DOCUMENTS

CN     108682306    * 10/2012  ............. G09F 9/301
CN     104851364 A    8/2015
(Continued)

OTHER PUBLICATIONS

Machine Translation of CN 108682306.*

*Primary Examiner* — Julia Slutsker (57) ABSTRACT

A flexible display panel and a display module are provided. The flexible display panel includes a bending section. At least one trace is defined with the bending section, and each trace includes at least one stress relief apparatus.

16 Claims, 5 Drawing Sheets

(52) U.S. Cl.
CPC ...... *H01L 51/5253* (2013.01); *H01L 51/5281* (2013.01); *H01L 2251/5338* (2013.01)

(58) Field of Classification Search
CPC ....... H01L 2251/5338; H01L 2251/558; Y02E 10/549; G09F 9/30
See application file for complete search history.

(56) References Cited

U.S. PATENT DOCUMENTS

| | | |
|---|---|---|
| 2018/0219165 A1 | 8/2018 | Kwon et al. |
| 2018/0342699 A1 | 11/2018 | Son et al. |
| 2019/0082528 A1* | 3/2019 | Zhang ................. H01L 51/0097 |
| 2019/0229282 A1 | 7/2019 | Zhang et al. |
| 2019/0237699 A1 | 8/2019 | Hu et al. |

FOREIGN PATENT DOCUMENTS

| | | |
|---|---|---|
| CN | 106205394 A | 12/2016 |
| CN | 106796949 A | 5/2017 |
| CN | 107068854 A | 8/2017 |
| CN | 107799574 A | 3/2018 |
| CN | 207134070 U | 3/2018 |
| CN | 107968109 A | 4/2018 |
| CN | 207624291 U | 7/2018 |
| CN | 108538897 A | 9/2018 |
| CN | 109004100 A | 12/2018 |
| CN | 109036141 A | 12/2018 |
| CN | 109164530 A | 1/2019 |
| CN | 109285463 A | 1/2019 |

* cited by examiner

FLEXIBLE OLED DISPLAY PANEL AND DISPLAY MODULE

FIELD OF INVENTION

The present invention relates to a field of display and, more particularly, to a flexible organic light-emitting display (OLED) display panel and a display module.

BACKGROUND OF INVENTION

With development of display technology, user demand for design of display panels is increasing, a narrow-frame design of a display panel, for example.

Chip on flexible printed circuits (COF) packing and chip on polyimide (COP) packing are generally using for mounting a driver IC on a lower frame of a conventional display panel, thereby making the lower frame of the conventional display panel thinner. However, the process is difficult and the cost is high. A bending section of the conventional display panel comprises a metal trace for transferring signals. When a bending rate of the conventional display panel reaches a certain value, the metal trace is prone to breakage, thereby making the conventional display panel unable to transfer signals.

Therefore, there is a need for a flexible display panel to solve the above problem.

SUMMARY OF INVENTION

The present invention provides a flexible display panel and a display module to solve the problem that a bending section of the conventional display panel is prone to breakage.

To solve the above problem, a technical solution provided by the present invention are as follows:

The present invention provides a display panel and a display module including a display region, and a non-display region disposed surrounding the display region. The non-display region includes a bending section.

At least one trace is defined within the bending section, and each trace includes at least one stress relief apparatus.

In the flexible display panel of the present invention, the trace includes a plurality of connecting portions. At least one stress relief apparatus is disposed between two of the adjacent connecting portions.

In the flexible display panel of the present invention, each of the stress relief apparatuses is a hemispherical protrusion. Each of the connecting portions is a semi-cylindrical body.

In the flexible display panel of the present invention, a thickness of the stress relief apparatus is greater than a thickness of the connecting portion.

In the flexible display panel of the present invention, the shape of each trace is selected from a group consisting of a wavy line, a zigzag line, and a straight line along a direction of a top view of the flexible display panel.

In the flexible display panel of the present invention, the bending section includes a first bending section, a second bending section, and a third bending section. The first bending section is adjacent to the display region, the third bending section is away from the display region, and the second bending section is located between the first bending section and the third bending section.

A distribution density of the stress relief apparatuses distributed in the first bending section, the second bending section, and the third bending section are different.

In the flexible display panel of the present invention, a curvature radius of the second bending section is less than a curvature radius of the first bending section.

The curvature radius of the second bending section is less than a curvature radius of the third bending section.

The distribution density of the stress relief apparatuses distributed in the second bending section is greater than the distribution density of the stress relief apparatuses distributed in the first bending section. The distribution density of the stress relief apparatuses distributed in the second bending section is greater than the distribution density of the stress relief apparatuses distributed in the third bending section.

In the flexible display panel of the present invention, a curvature radius of the second bending section is less than a curvature radius of the first bending section. The curvature radius of the second bending section is less than a curvature radius of the third bending section.

A thickness of the stress relief apparatus is increased gradually along a direction from the first bending section to the second bending section.

The thickness of the stress relief apparatus is decreased gradually along a direction from the second bending section to the third bending section.

In the flexible display panel of the present invention, a curvature radius of the second bending section is greater than a curvature radius of the first bending section. The curvature radius of the second bending section is greater than a curvature radius of the third bending section.

The distribution density of the stress relief apparatuses distributed in the second bending section is less than the distribution density of the stress relief apparatuses distributed in the first bending section. The distribution density of the stress relief apparatuses distributed in the second bending section is less than the distribution density of the stress relief apparatuses distributed in the third bending section.

In the flexible display panel of the present invention, a curvature radius of the second bending section is greater than a curvature radius of the first bending section. The curvature radius of the second bending section is greater than a curvature radius of the third bending section.

A thickness of the stress relief apparatus is decreased gradually along a direction from the first bending section to the second bending section.

The thickness of the stress relief apparatus is increased gradually along a direction from the second bending section to the third bending section.

The present invention further provides a display module comprising a flexible display panel, a polarizing layer disposed on the flexible display panel, and a covering layer disposed on the flexible display panel. The flexible display panel comprises a display region, and a non-display region disposed surrounding the display region. The non-display region comprises a bending section.

At least one trace is defined within the bending section, each trace comprises at least one stress relief apparatus.

In the display module of the present invention, the trace comprises a plurality of connecting portions. At least one stress relief apparatus is disposed between two of the adjacent connecting portions.

In the display module of the present invention, each of the stress relief apparatuses is a hemispherical protrusion. Each of the connecting portions is a semi-cylindrical body.

In the display module of the present invention, a thickness of the stress relief apparatus is greater than a thickness of the connecting portion.

In the display module of the present invention, the shape of each trace is selected from the group consisting of a wavy line, a zigzag line, and a straight line along a direction of a top view of the flexible display panel.

In the display module of the present invention, the bending section comprises a first bending section, a second bending section, and a third bending section. The first bending section is adjacent to the display region, the third bending section is away from the display region, and the second bending section is located between the first bending section and the third bending section.

A distribution density of the stress relief apparatuses distributed in the first bending section, the second bending section, and the third bending section are different.

In the display module of the present invention, a curvature radius of the second bending section is less than a curvature radius of the first bending section. The curvature radius of the second bending section is less than a curvature radius of the third bending section.

The distribution density of the stress relief apparatuses distributed in the second bending section is greater than the distribution density of the stress relief apparatuses distributed in the first bending section. The distribution density of the stress relief apparatuses distributed in the second bending section is greater than the distribution density of the stress relief apparatuses distributed in the third bending section.

In the display module of the present invention, a curvature radius of the second bending section is less than a curvature radius of the first bending section. The curvature radius of the second bending section is less than a curvature radius of the third bending section.

A thickness of the stress relief apparatus is increased gradually along a direction from the first bending section to the second bending section.

The thickness of the stress relief apparatus is decreased gradually along a direction from the second bending section to the third bending section.

In the display module of the present invention, a curvature radius of the second bending section is greater than a curvature radius of the first bending section. The curvature radius of the second bending section is greater than a curvature radius of the third bending section.

The distribution density of the stress relief apparatuses distributed in the second bending section is less than the distribution density of the stress relief apparatuses distributed in the first bending section. The distribution density of the stress relief apparatuses distributed in the second bending section is less than the distribution density of the stress relief apparatuses distributed in the third bending section.

In the display module of the present invention, a curvature radius of the second bending section is greater than a curvature radius of the first bending section. The curvature radius of the second bending section is greater than a curvature radius of the third bending section.

A thickness of the stress relief apparatus is decreased gradually along a direction from the first bending section to the second bending section.

The thickness of the stress relief apparatus is increased gradually along a direction from the second bending section to the third bending section.

Beneficial effect of the present invention: A plurality of stress relief apparatuses are disposed on a trace. Therefore, the stress concentrated on the trace of a bending section is released, the bendability of the bending section is improved, the possibility of breakage of the trace is reduced, and quality of products is improved.

DESCRIPTION OF DRAWINGS

The accompanying figures to be used in the description of embodiments of the present disclosure or prior art will be described in brief to more clearly illustrate the technical solutions of the embodiments or the prior art. The accompanying figures described below are only part of the embodiments of the present disclosure, from which figures those skilled in the art can derive further figures without making any inventive efforts.

DETAILED DESCRIPTION OF PREFERRED EMBODIMENT

The specific embodiments described with reference to the attached drawings are all exemplary and are intended to illustrate and interpret the present disclosure. It should be understood that terms such as "upper," "lower," "front," "rear," "left," "right," "inside," "outside," "lateral," as well as derivative thereof should be construed to refer to the orientation as then described or as shown in the drawings under discussion. These relative terms are for convenience of description, do not require that the present disclosure be constructed or operated in a particular orientation, and shall not be construed as causing limitations to the present disclosure. In the attached drawings, wherein the identical or similar reference numerals constantly denote the identical or similar elements or elements having the identical or similar structures.

Figure 1:
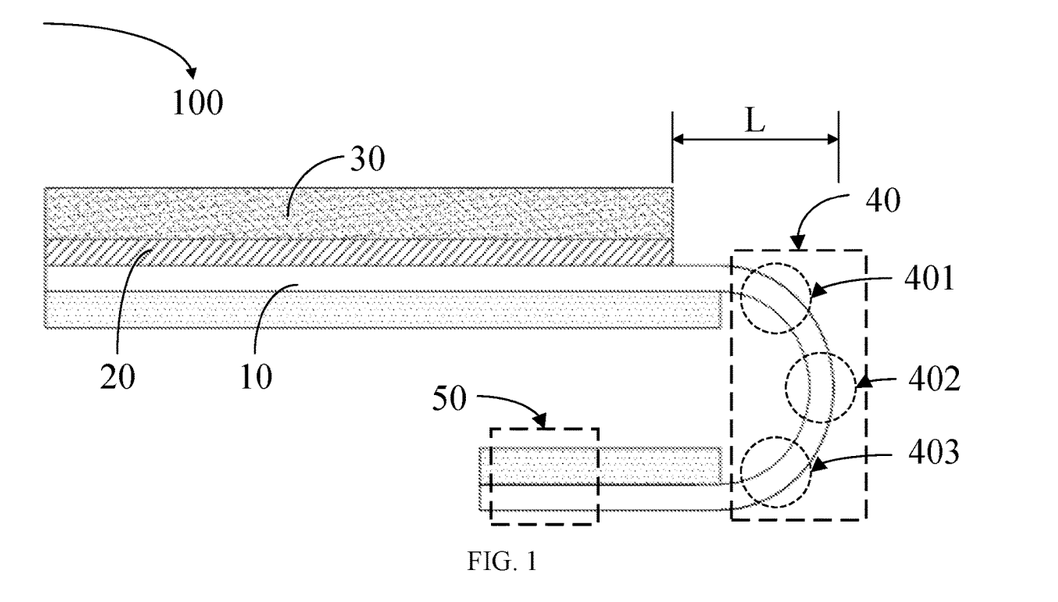
FIG. 1 is a structural diagram of the flexible display panel according to the present invention.

Please refer to FIG. 1. FIG. 1 is a schematic diagram of the flexible display panel according to the present invention.

Figure 2:
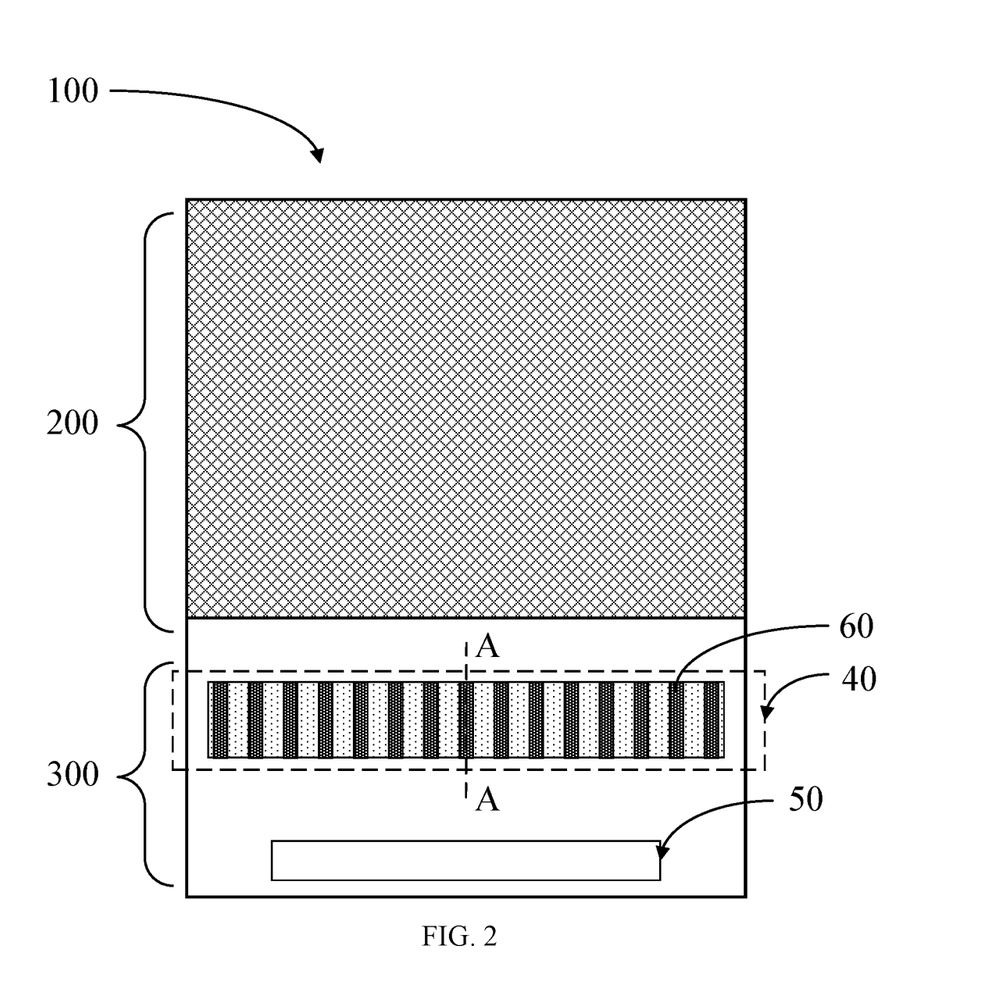
FIG. 2 is a development view of a bending section of the flexible display panel according to the present invention.

Please refer to FIG. 2. FIG. 2 is a development view of a bending section of the flexible display panel according to the present invention.

A flexible display panel 100 includes a substrate 10, a light-emitting device layer 20 disposed on the substrate 10, and an encapsulation layer 30 disposed on the substrate 10.

In one embodiment, the substrate 10 is a flexible substrate, and material of the flexible substrate is polyimide (PI).

The flexible display panel 100 includes a display region 200, and a non-display region 300 disposed surrounding the display region 200. The non-display region 300 includes a bending section 40 adjacent to the display region 200, and a binding section 50 away from the display region 200. The bending section 40 is disposed between the display region 200 and the binding section 50.

The bending section 40 includes a plurality of traces 60, and the traces 60 extend from the display region 200 through the bending section 40 to the binding section 50.

A driver IC and portion of the traces 60 of the flexible display panel 100 are bent to a back side of the display region 200 with respect to the bending section 40, thereby making a lower frame of the flexible display panel 100 thinner. For example, a spacing L in FIG. 1.

In one embodiment, a source/drain electrode of the flexible display panel 100 and the traces 60 are formed in the same mask process.

The shape of each trace 60 is selected from the group consisting of a wavy line, a zigzag line, and a straight line along a direction of a top view of the flexible display panel 100. In the present embodiment, the shape of the traces 60 is a straight line.

Figure 3:
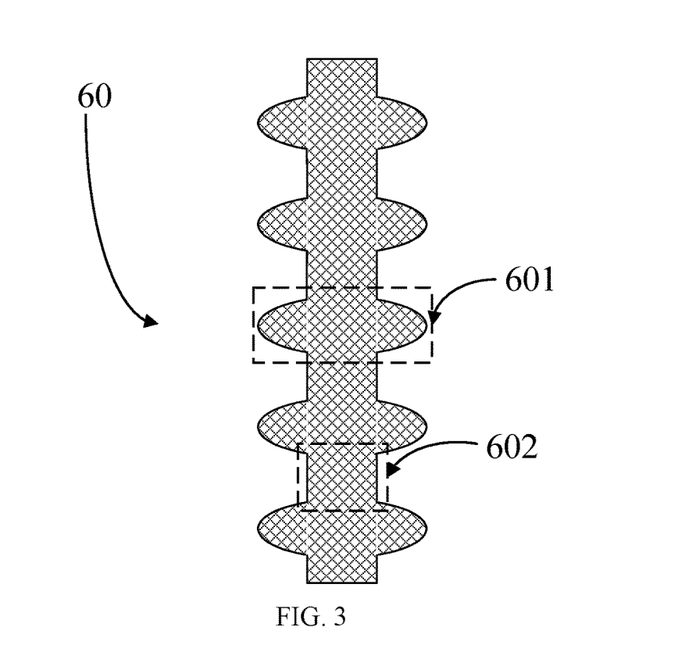
FIG. 3 is a top view of a trace of a bending section of the flexible display panel according to the present invention.

Please refer to FIG. 3. FIG. 3 is a top view of a trace of a bending section of the flexible display panel according to the present invention.

Each trace 60 includes at least one stress relief apparatus 601.

Each trace 60 further includes a connecting portion 602. At least one stress relief apparatus 601 is disposed between two of the adjacent connecting portions 602. In one embodiment, one, two or more stress apparatuses 601 may be disposed between two of the adjacent connecting portions 602, and the specific number is not limited here.

Figure 4:
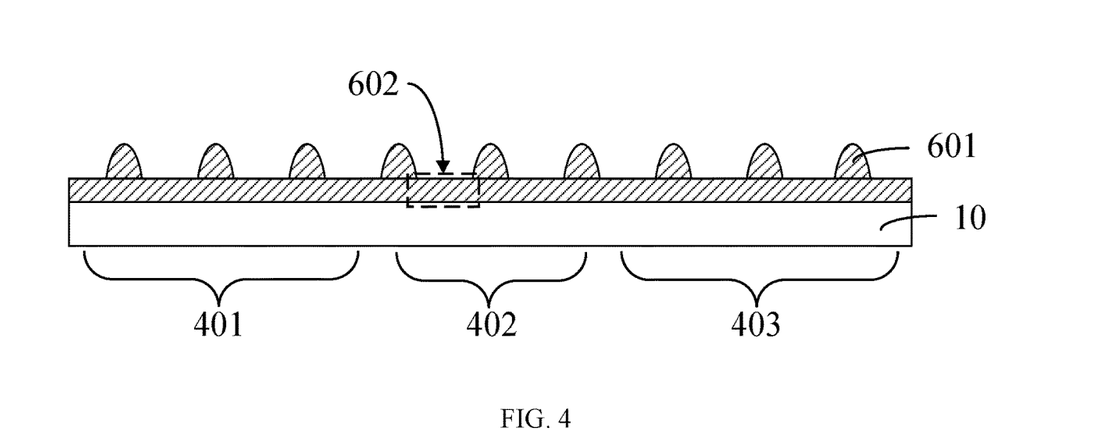
FIG. 4 is a first cross-sectional view of the flexible display panel of FIG. 2 taken along section A-A.

Please refer to FIG. 4. FIG. 4 is a first cross-sectional view of the flexible display panel of FIG. 2 taken along section A-A.

The stress relief apparatus 601 is disposed on the substrate 10. The stress relief apparatus 601 may be, but not limited to, a hemispherical protrusion. The connecting portion 602 may be, but not limited to, a semi-cylindrical body.

In one embodiment, a thickness of the stress relief apparatus 601 is greater than a thickness of the connecting portion 602.

Please refer to FIG. 1 and FIG. 2. The bending section 40 comprises a first bending section 401, a second bending section 402, and a third bending section 403. The first bending section 401 is adjacent to the display region 200, the third bending section 403 is away from the display region 200, and the third bending section 402 is disposed between the first bending section 401 and the third bending section 403.

In one embodiment, a distribution density of the stress relief apparatuses 601 distributed in the first bending section 401, the second bending section 402, and the third bending section 403 are different.

Please refer to FIG. 1, a curvature radius of the second bending section 402 is less than a curvature radius of the first bending section 401, and the curvature radius of the second bending section 402 is less than a curvature radius of the third bending section 403.

It can be seen from the mechanical analysis that the bending stress applied to the second bending section 402 is the largest. In other words, the second bending section 402 is the most easily broken region of the flexible substrate. The bending stress applied to the second bending section 402 is greater than the bending stress applied to the third bending section 403.

Figure 5:
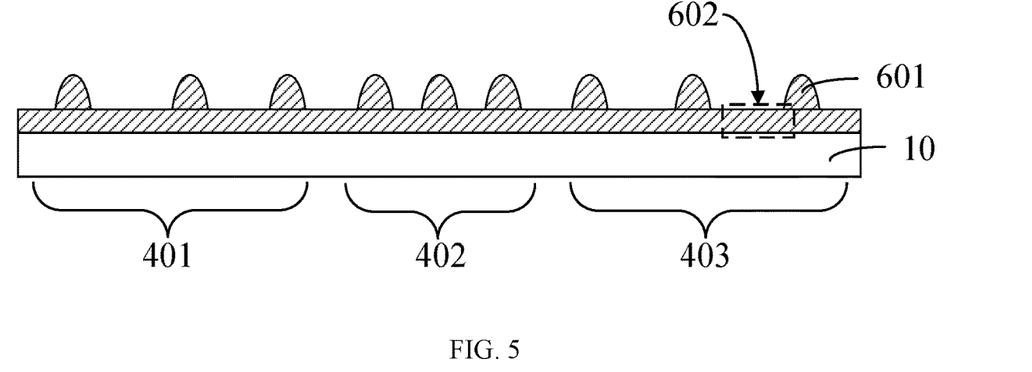
FIG. 5 is a second cross-sectional view of the flexible display panel of FIG. 2 taken along section A-A.

Please refer to FIG. 5, FIG. 5 is a second cross-sectional view of the flexible display panel of FIG. 2 taken along section A-A.

The distribution density of the stress relief apparatuses 601 distributed in the second bending section 402 is greater than the distribution density of the stress relief apparatuses 601 distributed in the first bending section 401. The distribution density of the stress relief apparatuses 601 distributed in the second bending section 402 is greater than the distribution density of the stress relief apparatuses 601 distributed in the third bending section 403.

On the basis of FIG. 5, the embodiment may also be:

The distribution density of the stress relief apparatuses 601 is increased gradually along a direction from the first bending section 401 to the second bending section 402. The distribution density of the stress relief apparatuses 601 is decreased gradually along a direction from the second bending section 402 to the third bending section 403.

A location having high bending stress is corresponding to a location having more stress relief apparatuses 601, and a location having low bending stress is corresponding to a location having less stress relief apparatuses 601. As a result, the bending stress of the flexible substrate is reduced, stress concentration is reduced, and the bendability of the flexible substrate is improved.

Figure 6:
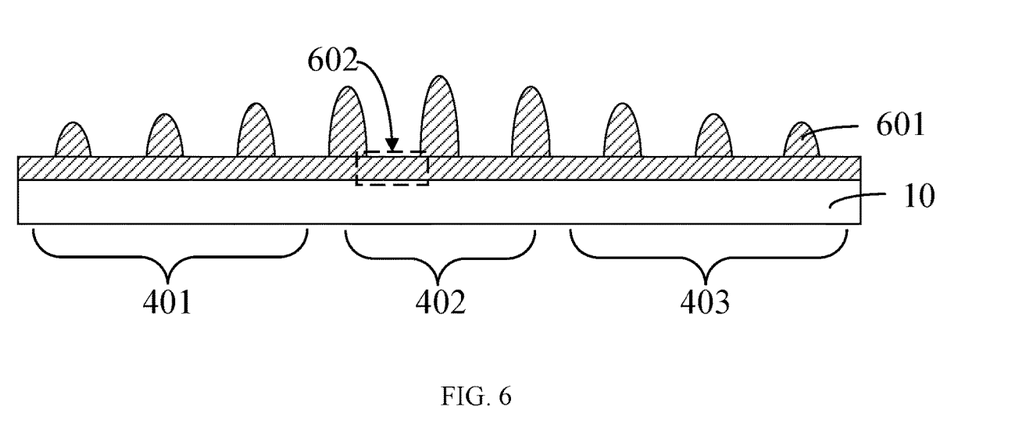
FIG. 6 is a third cross-sectional view of the flexible display panel of FIG. 2 taken along section A-A.

Please refer to FIG. 6, FIG. 6 is a third cross-sectional view of the flexible display panel of FIG. 2 taken along section A-A.

A thickness of the stress relief apparatus 601 disposed on the second bending section 402 is greater than a thickness of the stress relief apparatus 601 disposed on the first bending section 401. The thickness of the stress relief apparatus 601 disposed on the second bending section 402 is greater than a thickness of the stress relief apparatus 601 disposed on the third bending section 403.

On the basis of FIG. 6, the embodiment may also be:

A thickness of the stress relief apparatus 601 is increased gradually along a direction from the first bending section 401 to the second bending section 402. The thickness of the stress apparatus 601 is decreased gradually along a direction from the second bending section 402 to the third bending section 403.

A location having high bending stress is corresponding to a location having thicker stress relief apparatuses 601, and a location having low bending stress is corresponding to a location having thinner stress relief apparatuses 601. As a result, the bending stress of the flexible substrate is reduced, stress concentration is reduced, and the bendability of the flexible substrate is improved.

To obtain a thinner frame, when the flexible substrate is bent, the bending section 40 is bent into a circular arc. A curvature at two ends of bending section 40 is less than a curvature of the middle of the bending section 40.

In one embodiment, please refer to FIG. 1. A curvature radius of the second bending section 402 is greater than a curvature radius of the first bending section 401. The curvature radius of the second bending section 402 is greater than a curvature radius of the third bending section 403.

It can be seen from the mechanical analysis that the bending stress applied to the first bending section 401 and the bending stress applied to the third bending section 403 are the largest. In other words, the first bending section 401 and the third bending section 403 are the most easily broken region of the flexible substrate. The bending stress applied to the second bending section 402 is less than the bending stress applied to the first bending section 401. The bending stress applied to the second bending section 402 is less than the bending stress applied to the third bending section 403.

Figure 7:
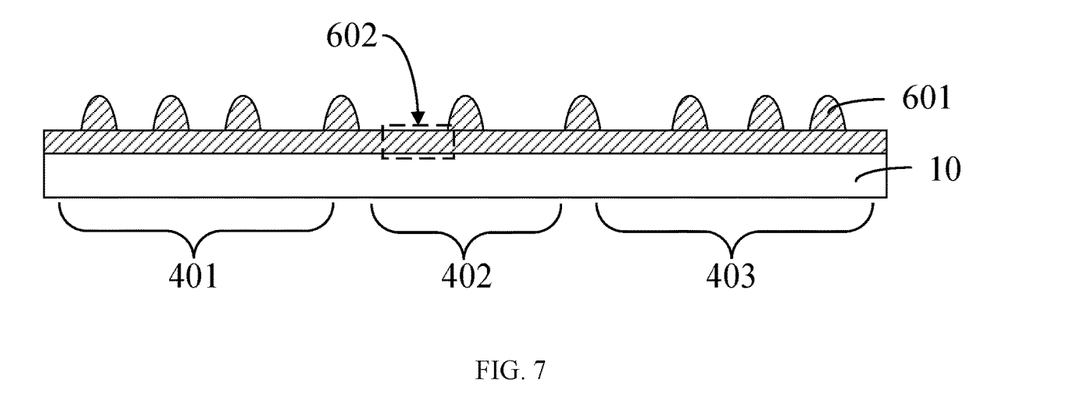
FIG. 7 is a fourth cross-sectional view of the flexible display panel of FIG. 2 taken along section A-A.

Please refer to FIG. 0.7, FIG. 7 is a fourth cross-sectional view of the flexible display panel of FIG. 2 taken along section A-A.

The distribution density of the stress relief apparatuses 601 distributed in the second bending section 402 is less than the distribution density of the stress relief apparatuses 601 distributed in the first bending section 401. The distribution density of the stress relief apparatuses 601 distributed in the second bending section 402 is less than the distribution density of the stress relief apparatuses 601 distributed in the third bending section 403.

On the basis of FIG. 7, the embodiment may also be:

The distribution density of the stress relief apparatuses 601 is decreased gradually along a direction from the first bending section 401 to the second bending section 402. The distribution density of the stress relief apparatuses 601 is increased along a direction from the second bending section 402 to the third bending section 403.

A location having high bending stress is corresponding to a location having more stress relief apparatuses 601, and a location having low bending stress is corresponding to a location having less stress relief apparatuses 601. As a result, the bending stress of the flexible substrate is reduced, stress concentration is reduced, and the bendability of the flexible substrate is improved.

Figure 8:
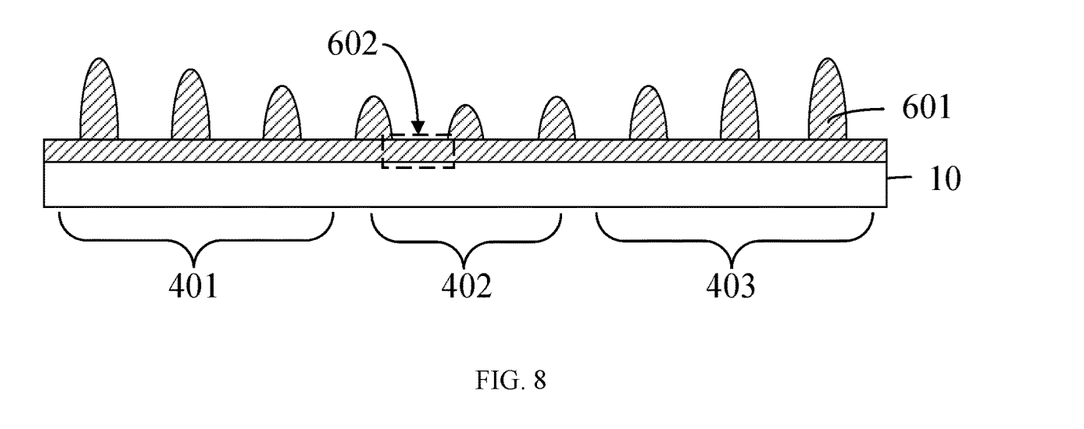
FIG. 8 is a fifth cross-sectional view of the flexible display panel of FIG. 2 taken along section A-A.

Please refer to FIG. 8, FIG. 8 is a fifth cross-sectional view of the flexible display panel of FIG. 2 taken along section A-A.

A thickness of the stress relief apparatus 601 disposed on the second bending section 402 is less than a thickness of the stress relief apparatus 601 disposed on the first bending section 401. The thickness of the stress relief apparatus 601 disposed on the second bending section 402 is less than a thickness of the stress relief apparatus 601 disposed on the third bending section 403.

On the basis of FIG. 8, the embodiment may also be:

A thickness of the stress relief apparatus 601 is decreased gradually along a direction from the first bending section 401 to the second bending section 402. The thickness of the stress apparatus 601 is increased gradually along a direction from the second bending section 402 to the third bending section 403.

A location having high bending stress is corresponding to a location having thicker stress relief apparatuses 601, a location having low bending stress is corresponding to a location having thinner stress relief apparatuses 601, thereby ensuring that a neutral axis of the bending section 40 is a smooth arc. As a result, stress concentration is reduced, and the bendability of the bending section 40 is improved.

On the basis of FIG. 5 to FIG. 8, the embodiment may also be:

The stress relief apparatus 601 is also disposed on the trace 60 adjacent to the first bending section 401 and the third bending section 403. By arranging the stress relief apparatus 601 on the trace 60 that has not been deformed, the bendability of the flexible substrate is further improved.

The present invention further provides a display module comprising the above flexible display panel, a polarizing layer disposed on the flexible display panel, and a cover layer disposed on the flexible display panel. The working principle of the display module is the same as the above flexible display panel, and details thereof will not be described here.

The present invention provides a flexible display panel and a display module. The flexible display panel includes a display region, and a non-display region disposed surrounding the display region. The non-display region includes a bending section. At least one trace is defined within the bending section, wherein each trace includes at least one stress relief apparatus. By arranging the stress relief apparatus on the trace, the stress concentrated on the trace of a bending section is released, the bendability of the bending section is improved, the possibility of breakage of the trace is reduced, and quality of products is improved.

In summary, the present disclosure has been described with a preferred embodiment thereof. The preferred embodiment is not intended to limit the present disclosure, and it is understood that many changes and modifications can be carried out without departing from the scope and the spirit of the disclosure that is intended to be limited only by the appended claims.

What is claimed is:

1. A flexible display panel, comprising:
a display region; and
a non-display region disposed surrounding the display region, wherein the non-display region comprises a bending region;
wherein the bending region comprises:
a first bending section;
a second bending section; and
a third bending section;
wherein the first bending section is adjacent to the display region, the third bending section is away from the display region, and the second bending section is located between the first bending section and the third bending section;
wherein at least one trace is defined within the bending region comprises at least one stress relief apparatus; and
wherein a thickness of the at least one stress relief apparatus decreases gradually along a direction from the first bending section to the second bending section and increases gradually along a direction from the second bending section to the third bending section.

2. The flexible display panel of claim 1, wherein the trace further comprises a plurality of connecting portions, and the at least one stress relief apparatus is disposed between two of the adjacent connecting portions.

3. The flexible display panel of claim 2, wherein the at least one stress relief apparatus is a hemispherical protrusion, and each of the connecting portions is a semi-cylindrical body.

4. The flexible display panel of claim 3, wherein a thickness of the at least one stress relief apparatus is greater than a thickness of each of the connecting portions.

5. The flexible display panel of claim 1, wherein a shape of the at least one trace is selected from a group consisting of a wavy line, a zigzag line, and a straight line along a direction of a top view of the flexible display panel.

6. The flexible display panel of claim 1,
wherein a distribution density of the at least one stress relief apparatus distributed in the first bending section, the second bending section, and the third bending section are different.

7. The flexible display panel of claim 6,
wherein the distribution density of the at least one stress relief apparatus distributed in the second bending section is greater than the distribution density of the at least one stress relief apparatus distributed in the first bending section, and the distribution density of the at least one stress relief apparatus distributed in the second bending section is greater than the distribution density of the at least one stress relief apparatus distributed in the third bending section.

8. The flexible display panel of claim 6,
wherein the distribution density of the at least one stress relief apparatus distributed in the second bending section is less than the distribution density of the at least one stress relief apparatus distributed in the first bending section, and the distribution density of the at least one stress relief apparatus distributed in the second bending section is less than the distribution density of the at least one stress relief apparatus distributed in the third bending section.

9. A display module comprising:
a flexible display panel;
a polarizing layer disposed on the flexible display panel; and
a covering layer disposed on the flexible display panel;
wherein the flexible display panel comprises:
a display region; and
a non-display region disposed surrounding the display region, wherein the non-display region comprises a bending region;
wherein the bending region comprises:
a first bending section;
a second bending section; and
a third bending section;
wherein the first bending section is adjacent to the display region, the third bending section is away from the display region, and the second bending section is located between the first bending section and the third bending section;
wherein at least one trace is defined within the bending region and comprises at least one stress relief apparatus; and
wherein a thickness of the at least one stress relief apparatus decreases gradually along a direction from the first bending section to the second bending section and increases gradually along a direction from the second bending section to the third bending section.

10. The display module of claim 9, wherein the trace further comprises a plurality of connecting portions, the at least one stress relief apparatus is disposed between two of the adjacent connecting portions.

11. The display module of claim 10, wherein each of the at least one stress relief apparatus is a hemispherical protrusion, and each of the connecting portions is a semi-cylindrical body.

12. The display module of claim 11, wherein a thickness of the at least one stress relief apparatus is greater than a thickness of the connecting portion.

13. The display module of claim 9, wherein a shape of the at least one trace is selected from the group consisting of a wavy line, a zigzag line, and a straight line along a direction of a top view of the flexible display panel.

14. The display module of claim 9,
wherein a distribution density of the at least one stress relief apparatus distributed in the first bending section, the second bending section, and the third bending section are different.

15. The display module of claim 14,
wherein the distribution density of the at least one stress relief apparatus distributed in the second bending section is greater than the distribution density of the at least one stress relief apparatus distributed in the first bending section, and the distribution density of the at least one stress relief apparatus distributed in the second bending section is greater than the distribution density of the at least one stress relief apparatus distributed in the third bending section.

16. The display module of claim 14,
wherein the distribution density of the at least one stress relief apparatus distributed in the second bending section is less than the distribution density of the at least one stress relief apparatus distributed in the first bending section, and the distribution density of the at least one stress relief apparatus distributed in the second bending section is less than the distribution density of the at least one stress relief apparatus distributed in the third bending section.

* * * * *